(12) United States Patent
Tamboli et al.

(10) Patent No.: US 8,569,085 B2
(45) Date of Patent: Oct. 29, 2013

(54) PHOTOELECTROCHEMICAL ETCHING FOR CHIP SHAPING OF LIGHT EMITTING DIODES

(75) Inventors: Adele Tamboli, Pasadena, CA (US); Evelyn L. Hu, Cambridge, MA (US); James S. Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 460 days.

(21) Appl. No.: 12/576,946

(22) Filed: Oct. 9, 2009

(65) Prior Publication Data

US 2010/0090240 A1 Apr. 15, 2010

Related U.S. Application Data

(60) Provisional application No. 61/104,015, filed on Oct. 9, 2008.

(51) Int. Cl.
*H01L 21/00* (2006.01)
*H01L 31/00* (2006.01)

(52) U.S. Cl.
USPC .. 438/31; 257/79; 257/E21.599; 257/E33.023

(58) Field of Classification Search
CPC ......... H01L 33/20; H01L 33/22; H01L 33/32; H01L 33/42; H01L 29/33
USPC ............................................. 257/79; 438/31
See application file for complete search history.

(56) References Cited

U.S. PATENT DOCUMENTS 3,739,217 A 6/1973 Bergh et al.
4,369,099 A 1/1983 Kohl et al.
4,404,072 A 9/1983 Kohl et al.
5,773,369 A 6/1998 Hu et al.
5,824,206 A 10/1998 Quinlan
5,877,038 A 3/1999 Coldren et al.
5,895,223 A 4/1999 Peng et al.
6,294,475 B1 * 9/2001 Schubert et al. .............. 438/712

(Continued)

FOREIGN PATENT DOCUMENTS

WO 2006076207 7/2006

OTHER PUBLICATIONS

International Search Report mailed Dec. 10, 2009, International application No. PCT/US2009/060244, International filing date Oct. 9, 2009.

(Continued)

*Primary Examiner* — William D Coleman
*Assistant Examiner* — Igwe U Anya
(74) *Attorney, Agent, or Firm* — Gates & Cooper LLP (57) ABSTRACT

A photoelectrochemical (PEC) etch is performed for chip shaping of a device comprised of a III-V semiconductor material, in order to extract light emitted into guided modes trapped in the III-V semiconductor material. The chip shaping involves varying an angle of incident light during the PEC etch to control an angle of the resulting sidewalls of the III-V semiconductor material. The sidewalls may be sloped as well as vertical, in order to scatter the guided modes out of the III-V semiconductor material rather than reflecting the guided modes back into the III-V semiconductor material. In addition to shaping the chip in order to extract light emitted into guided modes, the chip may be shaped to act as a lens, to focus its output light, or to direct its output light in a particular way.

18 Claims, 6 Drawing Sheets

(56) References Cited

U.S. PATENT DOCUMENTS

| | | | |
|---|---|---|---|
| 6,343,171 B1 | 1/2002 | Yoshimura et al. | |
| 6,605,548 B1 | 8/2003 | Bardwell | |
| 6,630,692 B2 | 10/2003 | Goetz et al. | |
| 6,717,185 B2 | 4/2004 | Edmond et al. | |
| 6,884,470 B2 | 4/2005 | Gorman | |
| 6,884,740 B2* | 4/2005 | Hu et al. | 438/708 |
| 7,026,255 B2 | 4/2006 | Wolff | |
| 7,125,734 B2 | 10/2006 | Sackrison et al. | |
| 7,268,371 B2 | 9/2007 | Krames et al. | |
| 7,279,345 B2 | 10/2007 | Camras et al. | |
| 7,344,958 B2 | 3/2008 | Murai et al. | |
| 7,550,395 B2 | 6/2009 | Hu et al. | |
| 7,704,763 B2 | 4/2010 | Fujii et al. | |
| 7,719,020 B2 | 5/2010 | Murai et al. | |
| 7,994,527 B2 | 8/2011 | DenBaars et al. | |
| 8,053,264 B2* | 11/2011 | Tamboli et al. | 438/47 |
| 8,263,500 B2* | 9/2012 | Tamboli et al. | 438/708 |
| 2003/0180980 A1 | 9/2003 | Margalith et al. | |
| 2005/0098095 A1 | 5/2005 | D'Evelyn et al. | |
| 2005/0159000 A1 | 7/2005 | Ohno et al. | |
| 2005/0179130 A1* | 8/2005 | Tanaka et al. | 257/730 |
| 2006/0011935 A1* | 1/2006 | Krames et al. | 257/99 |
| 2006/0110386 A1* | 5/2006 | Reche-Gallardo et al. | 424/143.1 |
| 2006/0110839 A1* | 5/2006 | Dawson et al. | 438/22 |
| 2006/0110926 A1 | 5/2006 | Hu et al. | |
| 2006/0186418 A1* | 8/2006 | Edmond et al. | 257/79 |
| 2006/0214173 A1* | 9/2006 | Beeson et al. | 257/88 |
| 2007/0069225 A1 | 3/2007 | Krames et al. | |
| 2007/0121690 A1 | 5/2007 | Fujii et al. | |
| 2008/0035936 A1* | 2/2008 | Lester | 257/79 |
| 2008/0073657 A1* | 3/2008 | Liang et al. | 257/89 |
| 2008/0121913 A1 | 5/2008 | McKenzie et al. | |
| 2008/0121918 A1* | 5/2008 | DenBaars et al. | 257/98 |
| 2008/0182420 A1 | 7/2008 | Hu et al. | |
| 2009/0227109 A1* | 9/2009 | Yang et al. | 438/689 |
| 2009/0283800 A1 | 11/2009 | Im et al. | |
| 2009/0289263 A1* | 11/2009 | Duong et al. | 257/77 |
| 2009/0315055 A1* | 12/2009 | Tamboli et al. | 257/98 |
| 2010/0025317 A1 | 2/2010 | Fall et al. | |
| 2010/0025717 A1* | 2/2010 | Fujii et al. | 257/98 |
| 2010/0072518 A1 | 3/2010 | Shen et al. | |
| 2010/0090240 A1 | 4/2010 | Tamboli et al. | |
| 2010/0195684 A1 | 8/2010 | Tamboli et al. | |
| 2010/0289043 A1 | 11/2010 | DenBaars et al. | |
| 2010/0317132 A1 | 12/2010 | Rogers et al. | |

OTHER PUBLICATIONS

Kao, C. et al., "Light-output enhancement in a nitride-based light-emitting diode with 22 undercut sidewalls," IEEE Photonics Technology Letters, vol. 17, No. 1, Jan. 2005, pp. 19-21.

Krames, M. et al., "High-power truncated-inverted-pyramid (AlxGa1-x)0.5In0.5P/GaP light-emitting diodes exhibiting >50% external quantum efficiency," Applied Physics Letters, vol. 75, No. 16, Oct. 18, 1999, p. 2365-2367.

Lee, C. et al., "High brightness GaN-based flip-chip light-emitting diodes by adopting geometric sapphire shaping structure," Semicond. Sci. Technol. 23, 2008, five pages.

Murai, A. et al., "Hexagonal pyramid shaped light-emitting diodes based on ZnO and GaN direct wafer bonding," Applied Physics Letters 89, 2006, pp. 171116-1-171116-3.

Shmatov, O. et al., "Truncated-inverted-pyramid light emitting diode geometry optimisation using ray tracing technique," IEE Proc.—Optoelectron., vol. 150, No. 3, Jun. 2003, pp. 273-277.

Zhu, Y. et al., "Enhanced output of flip-chip light-emitting diodes with a sidewall reflector," Solid-State Electronics 51, 2007, pp. 674-677.

Ben-Yaacov et al., "AlGaN/GaN current aperture vertical electron transistors," Device Research Conference (Cat. No. 02TH8606). IEEE, 2002, pp. 31-32.

Borton et al., "Bias-assisted photoelectrochemical etching of p-GaN at 300 K," Applied Physics Letters, vol. 77 (8) p. 1227 (2000).

Choi, Y. et al., "GaN blue photonic crystal membrane nanocavities," Applied Physics Letters, vol. 87, 2005, pp. 6925-6927.

Dorogan et al., "Photoelectrochemical etching of GaN-AlGaN heterostructures formed on sapphire substrates," Moldavian Journal of the Physical Sciences, N2, 2002, pp. 156-159.

Edwards et al, "InGaN/GaN quantum well microcavities formed by laser lift-off and plasma etching," Wiley-VCH. Physica Status Solidi B-Basic Research, vol. 228, No. 1, pp. 91-94, 2001.

Fujii, T. et al., "Increase in the extraction efficiency of GaN-based light-emitting diodes via surface roughening," Applied Physics Letters, vol. 84, No. 6, Feb. 9, 2004, pp. 855-857.

Gao. et al: "Al GaN/GaN current aperture vertical electron transistors fabricated by photoelectrochemical wet etching" Electronics Letters, IEE Stevenage, GB, vol. 39, No. 1, Jan. 9, 2003, pp. 148-149.

Haberer, E. et al., "Free-standing, optically pumped, GaN/InGaN microdisk lasers fabricated by photoelectrochemical etching," Applied Physics Letters, vol. 85, No. 22, Nov. 29, 2004, pp. 5179-5181.

Haberer, E. et al., "Removal of thick (>100 nm) InGaN layers for optical devices using band-gap-selective photoelectrochemical etching," Applied Physics Letters, vol. 85, No. 5, Aug. 2, 2004, pp. 762-764.

Huh et al., "Improved light-output and electrical performance of InGaN-based light emitting diode by microroughening of the p-GaN surface," J. of Appl. Phys. 93(11), pp. 9383-9385 (2003).

Hwang et al., "Efficient wet etching of GaN and p-GaN assisted with chopped UV source," Superlattices and Microstructures, vol. 35, 2004, pp. 45-57.

Khare, R., "The wet photoelectrochemical etching of III-V semiconductors," in Electrical and Computer Engineering, Santa Barbara: University of California, Santa Barbara, 1993, pp. 1-184.

Martin et al., "Optical spectroscopy of GaN microcavities with thicknesses controlled using a plasma etchback," Applied Physics Letters, vol. 79, No. 19, pp. 3029-3031, Nov. 5, 2001.

Martin et al., "GaN microcavities formed by laser lift-off and plasma etching," Materials Science & Engineering B-Solid State Materials for Advanced Technology, vol. B93, pp. 98-101, 2002.

Meier, C. et al., "Visible resonant modes in GaN-based photonic crystal membrane cavities," Applied Physics Letters, vol. 88, 2006, pp. 031111-1-031111-3.

Minsky et al., "Room-temperature photoenhanced wet etching of GaN," Appl. Phys. Lett. 68(11), pp. 1531-1533 (1996).

Na et al., "Selective wet etching of p-GaN for efficient GaN-based light emitting diodes," IEEE Photonics Technology Letters 18, No. 14, p. 1512 (2006).

Ng et al., "Patterning GaN Microstructures by Polarity-Selective Chemical Etching", Japanese Journal of Applied Physics, Japan Society of Applied Physics, Tokyo, JP, vol. 42, No. 12A, Part 2, Dec. 1, 2003, pp. L1405-L1407, XP001186585.

Palacios et al., "Wet Etching of GaN Grown by Molecular Beam Epitaxy on SI (111)"; Semiconductor Science and Technology, IOP, Bristol, GB, vol. 15, No. 10, Oct. 2000, pp. 96-1000, XP000976071.

Pearton, S. J.: "A review of dry etching of GaN and related materials" MRS Internet Journal of Nitride Semiconductor Research, vol. 5, No. 11, Nov. 16, 2000. (Retrieved from the Internet: URL:http://nsr.mij.mrs.org./5/11/complete.html.).

Podlesnik et al., "Deep ultraviolet induced wet etching of GaAs," Applied Physics Letters 45 (5), p. 563 (1984).

Sharma, R. et al., "Vertically oriented GaN-based air-gap distributed Bragg reflector structure fabricated using band-gap-selective photoelectrochemical etching," Applied Physics Letters, vol. 87, 2005, pp. 051107-1-051107-3.

Stocker et al., "Crystallographic wet chemical etching of p-type GaN," Journal of the Electrochemical Society 147 (2), p. 763 (2000).

Stocker, "Crystallographic wet chemical etching of GaN," Appl. Phys. Lett. 1998, 73(18):2654-2656.

Stonas, A. et al., "Backside-illuminated photoelectrochemical etching for the fabrication of deeply undercut GaN structures," Applied Physics Letters, vol. 77, No. 16, Oct. 16, 2000, pp. 2610-2612.

Stonas, A. et al., "Development of selective lateral photoelectrochemical etching of InGaN/GaN for lift-off applications," Applied Physics Letters, vol. 78, No. 13, Mar. 26, 2001, pp. 1945-1947.

(56) References Cited

OTHER PUBLICATIONS

Stonas, A. et al., "Photoelectrochemical undercut etching for fabrication of GaN microelectochemical systems," J. Vac. Sci. Technol. B, vol. 19, No. 6, Nov./Dec. 2001, pp. 2838-2841.

Stonas et al., "Gallium Nitride-Based Micro-Opto-Electro-Mechanical Systems," in Electrical and Computer Engineering Department Santa Barbara: University of California, Santa Barbara, Dec. 2003, pp. 1-132.

Strittmatter, R. et al., "Fabrication of GaN suspended microstructures," Applied Physics Letters, vol. 78, No. 21, May 21, 2001, pp. 3226-3228.

Tamboli, A. et al., "Smooth top-down photoelectrochemical etching of m-plane GaN," Journal of the Electrochemical Society, 156 (1), 2009, pp. H47-H51.

Tamboli et al., "Photoelectrochemical etching of p-type GaN heterostructures," Applied Physics Letters 94, 2009, 151113-1-151113-3.

Tamboli et al., "Photoelectrochemical roughening of p-GaN for light extraction from GaN/InGaN light emitting diodes," Phys. Status Solidi C 6, No. S2, 2009, S807-S810.

Van De Ven et al., "Photo-assisted etching of p-type semiconductors," Journal Electrochemical Society, vol. 138, No. 11, p. 3401 (1991).

Wong et al., "Structural and optical quality of GaN/metal/Si heterostructures fabricated by excimer laser lift-off," Applied Physics Letters, vol. 75, No. 13, pp. 1887-1889, Sep. 27, 1999.

Wong et al., "Damage-free separation of GaN thin films from sapphire substrates," Applied Physics Letters, vol. 72, No. 5, pp. 599-601, Feb. 2, 1998.

Yang et al., "Photoenhanced electrochemical etching for p-GaN," Electronics Letters 36, No. 1, p. 88 (2000).

Yoshida, "Electrochemical etching of a conductive GaN crystal for patterning," J. of Crystal Growth 181, 1997, pp. 293-296.

Youtsey, C. et al., "Dopant-selective photoenhanced wet etching of GaN," Journal of Electronic Materials, vol. 27, No. 4, 1998, pp. 282-287.

Youtsey, C. et al., "Gallium nitride whiskers formed by selective photoenhanced wet etching of dislocations," Applied Physics Letters, vol. 73, No. 6, Aug. 10, 1998, pp. 797-799.

International Search Report, International application No. PCT/US09/43643, International filing date May 12, 2009.

International Search Report mailed Mar. 19, 2010, International application No. PCT/US10/22753, International filing date Feb. 1, 2010.

International Search Report, International application No. PCT/US09/43641, International filing date May 12, 2009.

Chinese Office Action (with English translation) dated Oct. 31, 2012 for Chinese Patent Application No. 2009801396747.

\* cited by examiner

PHOTOELECTROCHEMICAL ETCHING FOR CHIP SHAPING OF LIGHT EMITTING DIODES

CROSS REFERENCE TO RELATED APPLICATION

This application claims the benefit under 35 U.S.C. Section 119(e) of co-pending and commonly-assigned U.S. Provisional Application Ser. No. 61/104,015 filed on Oct. 9, 2008, by Adele Tamboli, Evelyn L. Hu and James S. Speck, entitled "PHOTOELECTROCHEMICAL ETCHING FOR CHIP SHAPING OF LIGHT EMITTING DIODES," which application is incorporated by reference herein.

This application is related to the following and commonly-assigned U.S. patent applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," now U.S. Pat. No. 7,704,763, issued Apr. 27, 2010, which application claims the benefit under 35 U.S.C Section 365(c) of PCT Application Serial No. US2003/039211, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/175,761, filed on Jul. 6, 2005, now U.S. Pat. No. 7,344,958, issued Mar. 18, 2008, by Akihiko Murai, Lee McCarthy, Umesh K. Mishra, and Steven P. DenBaars, entitled "METHOD FOR WAFER BONDING (Al, In, Ga)N and Zn(S, Se) FOR OPTOELECTRONICS APPLICATIONS," now U.S. Pat. No. 7,344,958, issued Mar. 18, 2008, which application claims the benefit under 35 U.S.C Section 119(e) of U.S. Provisional Application Ser. No. 60/585,673 filed on Jul. 6, 2004, by Akihiko Murai, Lee McCarthy, Umesh K. Mishra, and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," now U.S. Pat. No. 7,719,020, issued May 18, 2010, which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," now U.S. Pat. No. 7,994,527, issued Aug., 9, 2011, which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/940,848, filed on Nov. 15, 2007, by Steven P. DenBaars, Aurelien J. F. David, Akihiko Murai, and Claude C. A. Weisbuch, entitled "HIGH LIGHT EXTRACTION EFFICIENCY LIGHT EMITTING DIODE (LED) THROUGH MULTIPLE EXTRACTORS," which application claims the benefit under 35 U.S.C Section 119(e) of U.S. Provisional Application Ser. No. 60/866,014, filed on Nov. 15, 2006, by Steven P. DenBaars, Aurelien J. F. David, and Claude C. A. Weisbuch, entitled "HIGH LIGHT EXTRACTION EFFICIENCY LIGHT EMITTING DIODE (LED) THROUGH MULTIPLE EXTRACTORS," and U.S. Provisional Application Ser. No. 60/883,977, filed on Jan. 8, 2007, by Steven P. DenBaars, Aurelien J. F. David, Akihiko Murai, and Claude C. A. Weisbuch, entitled "HIGH LIGHT EXTRACTION EFFICIENCY LIGHT EMITTING DIODE (LED) THROUGH MULTIPLE EXTRACTORS,";

U.S. Utility application Ser. No. 12/464,711, filed on May 12, 2009, by Adele Tamboli, Evelyn L. Hu, Steven P. DenBaars and Shuji Nakamura, entitled "PHOTOELECTROCHEMICAL ROUGHENING OF P-SIDE-UP GaN-BASED LIGHT EMITTING DIODES," which application claims the benefit under 35 U.S.C. Section 119(e) of U.S. Provisional Application Ser. No. 61/052,417, filed on May 12, 2008, by Adele Tamboli, Evelyn L. Hu, Steven P. DenBaars, and Shuji Nakamura, entitled "PHOTOELECTROCHEMICAL ROUGHENING OF Ga-FACE, P-SIDE-UP GaN BASED LIGHT EMITTING DIODES,";

U.S. Utility application Ser. No. 12/464,723, filed on May 12, 2009, by Adele Tamboli, Evelyn L. Hu, Matthew C. Schmidt, Shuji Nakamura, and Steven P. DenBaars, entitled "PHOTOELECTROCHEMICAL ETCHING OF P-TYPE SEMICONDUCTOR HETEROSTRUCTURES," now U.S. Pat. No. 8,053,264, issued Nov. 8, 2011, which application claims the benefit under 35 U.S.C Section 119(e) of U.S. Provisional Application Ser. No. 61/052,421, filed on May 12, 2008, by Adele Tamboli, Evelyn L. Hu, Matthew C. Schmidt, Shuji Nakamura, and Steven P. DenBaars entitled "PHOTOELECTROCHEMICAL ETCHING OF P-TYPE SEMICONDUCTOR HETEROSTRUCTURES,"; and U.S. Provisional Application Ser. No. 61/148,679, filed on Jan. 30, 2009, by Adele Tamboli, Evelyn L. Hu, Arpan Chakraborty, and Steven P. DenBaars, entitled "PHOTOELECTROCHEMICAL ETCHING FOR LASER FACETS,";

which applications are incorporated by reference herein.

BACKGROUND OF THE INVENTION

1. Field of Invention

The present invention relates to photoelectrochemical etching (PEC) for chip shaping of light emitting diodes (LEDs).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

In LEDs, especially in GaN (gallium nitride) and GaP (gallium phosphide) based devices, external quantum efficiency is limited by light emitted into guided modes trapped in the material. Typically, when wafers are diced, the resulting sidewalls are smooth and vertical, resulting in most of the light reflecting back into the material, where it is eventually lost, with only a small percentage of light being extracted into air.

A number of previous patents and research articles have discussed the benefits of modifying the geometry or shape of an LED chip to overcome these problems. For example, it is well known [1-6] that chip shaping into a pyramidal geometry will dramatically increase extraction efficiency, because light has a much higher probability of being incident on the sloped sidewalls at less than the critical angle for extraction into air. However, such designs are generally not rectilinear (a straight line), e.g., the side surface (not parallel to the epitaxial layers) are formed at distinctive angles relative to the normal (i.e., the surface normal).

Chip shaping may involve shaping of the LED device and material, accompanied by shaping of the substrate material, which may be of different composition (e.g., sapphire). Typically, wafers are shaped into this geometry by mechanical sawing using a beveled blade [1], wet etching of a foreign submount [3,5], or dry etch shaping using an etch mask with inclined facets [4] or a zero-bias etch [6].

Generally, etching is the preferred method. However, in III-V semiconductor based devices, etching processes are limited because there is no simple wet etch available. Moreover, both wet and dry etching gives very little control over the angle of the resulting etched sidewalls, providing few options for chip shapes.

Consequently, there is a need in the art for improved etching processes for chip shaping of III-V semiconductor based devices. The present invention satisfies this need.

SUMMARY OF THE INVENTION

To overcome the limitations in the prior art described above, and to overcome other limitations that will become apparent upon reading and understanding the present invention, the present invention discloses a PEC etch that is performed for chip shaping of a device comprised of a III-V semiconductor material, in order to extract light emitted into guided modes trapped in the III-V semiconductor material.

The III-V semiconductor material may comprise an n-type layer, a p-type layer, and an active region grown on a template or substrate, wherein the active region that generates and emits the light into the guided modes is in between the p-type layer and the n-type layer. The III-V semiconductor material may be a III-Nitride semiconductor material, for example. The orientation (growth plane) of the III-Nitride material and a light emitting surface of the active region may be an m-plane or a-plane, for example.

The chip shaping involves varying an angle of incident light during the PEC etch to control an angle of the resulting surfaces (e.g., sidewalls) of the III-V semiconductor material.

The sidewalls may be sloped as well as vertical, in order to scatter the guided modes out of the III-V semiconductor material rather than reflecting the guided modes back into the III-V semiconductor material. For example, the sidewalls may be at angles such that the light is more likely to be incident on the sidewall at an incident angle greater than the critical angle for total internal reflection (TIR). More specifically, each of the surfaces may be a sidewall at the angles such that the sidewall totally internally reflects more of the guided modes on a first pass towards a top surface of the device, so that more of the totally internally reflected guided modes are incident at the top surface within the critical angle for light extraction.

The chip shaping may further comprise varying the angle of the incident light to control a smoothness and surface roughness of the sidewall. For example, the surface roughness of the sidewall may be sufficiently smaller than a wavelength of the light emitted into the guided modes to prevent scattering of the guided modes' light by the surface roughness, so that the sidewall's surface is specular for the wavelength. As a result of the present invention, it is possible to obtain sidewall angles and sidewall surface roughness that are not substantially determined by a crystallography of the III-V semiconductor material. However, arbitrarily smooth or rough (including patterned) sidewalls may be obtained.

In addition to shaping the chip in order to extract light emitted into guided modes, the chip may be shaped to act as a lens, to focus its output light, or to direct its output light in a particular way. For example, the surfaces may comprise one or more curved surfaces and the chip shaping may further comprise varying the angle of the incident light to fabricate the curved surfaces (e.g., the angle of the incident light may shape and position the curved surface to define a lens that focuses or directs the light emitted by the active region). Thus, the lens may comprise a III-Nitride semiconductor material layer grown and shaped on top of the active layer, or shaped in the substrate or template.

The PEC etch may also be performed to dice a wafer comprising a plurality of the devices into distinct chips.

As a result, the present invention further discloses an LED, comprising III-Nitride semiconductor material comprising an active region for generating and emitting light; one or more etched surfaces of the III-Nitride material that have a surface smoothness; and an inclination of the surfaces at one or more sloped angles relative to a light emitting surface of the active region, wherein the inclination and the surface smoothness enhance extraction of the light emitted into guided modes trapped in the III-Nitride semiconductor material.

Finally, the present invention discloses an apparatus for fabricating semiconductor device, comprising an electrochemical cell for chemically etching a III-V semiconductor material during a PEC etch; a light source for emitting incident light onto the III-V semiconductor material; and means for re-positioning the incident light relative to the III-V semiconductor material in the electrochemical cell, wherein the re-positioning varies an angle of the incident light during the PEC etch to control a direction of the PEC etching, thereby controlling an angle of resulting sidewalls of the III-V semiconductor material and chip shaping the device comprised of the III-V semiconductor material in order to extract light emitted into guided modes trapped in the III-V semiconductor material.

BRIEF DESCRIPTION OF THE DRAWINGS

Referring now to the drawings in which like reference numbers represent corresponding parts throughout:

FIGS. 3(a)-(d) comprise scanning electron microscope (SEM) images of a sample PEC etched with angled illumination, wherein

FIGS. 7-10 are examples of chip geometries that may be achieved using the PEC etching of the present invention, where the examples are based on U.S. Pat. Nos. 7,268,371 and 7,279,345, wherein

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes the use of PEC etching for chip shaping of III-V semiconductor based devices, such as GaN-based and GaAs-based LEDs. Using the technique of the present invention, the material in between LEDs when they are grown on III-V substrates can be directly etched, and by varying the angle of incident light, the angle of the resulting sidewalls can be controlled, resulting in sloped sidewalls, which will scatter guided modes out of the material rather than reflecting them back. Using PEC etching, non-rectilinear chip shapes can be obtained by controlling the direction of incident light during etching, rather than needing to use mechanical dicing or crystallographic wet etching of a foreign substrate.

Technical Description

Nomenclature

The term "(Al,Ga,In)N" or III-Nitride as used herein is intended to be broadly construed to include respective nitrides of the single species, Al, Ga, and In, as well as binary, ternary and quaternary compositions of such Group III metal species. Accordingly, the term (Al, Ga, In)N comprehends the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in reference to GaN materials is applicable to the formation of various other (Al, Ga, In)N material species. Further, (Al,Ga,In)N materials within the scope of the invention may further include minor quantities of dopants and/or other impurity or inclusional materials.

Apparatus

Figure 1:
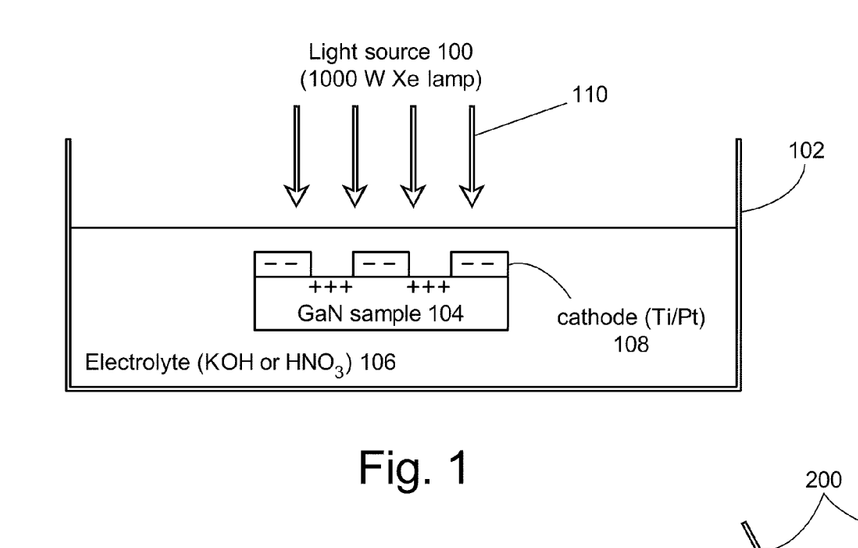
FIG. 1 is a diagram of a PEC etching apparatus.

PEC etching is a photo-assisted wet etch process that can be used to etch III-V semiconductors, such as GaN and GaAs, and their alloys. FIG. 1 is a diagram of a PEC etching apparatus, wherein the PEC etching comprises of a light source 100 and an electrochemical cell 102, where a semiconductor (e.g., GaN sample 104) immersed in an electrolyte 106 (e.g., KOH or $HNO_3$) acts as the anode and has metal (usually a titanium/platinum bilayer) in contact with or patterned directly thereon to act as the cathode 108. Light 110 generates electron-hole pairs in the semiconductor 104, and electrons (−) are extracted through the cathode 108, while holes (+) participate in oxidation reactions at the semiconductor surface, causing it to be dissolved in the electrolyte 106.

Figure 2:
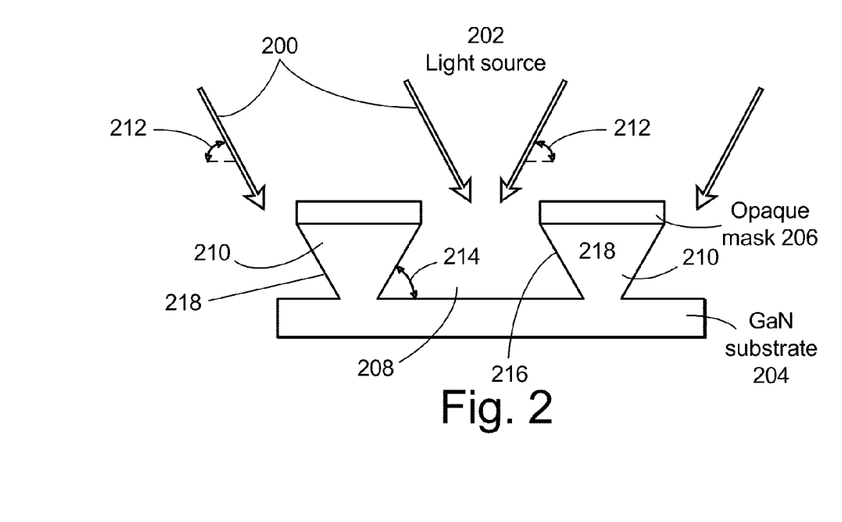
FIG. 2 is a diagram of PEC etching with angled illumination.
Figure 3A:
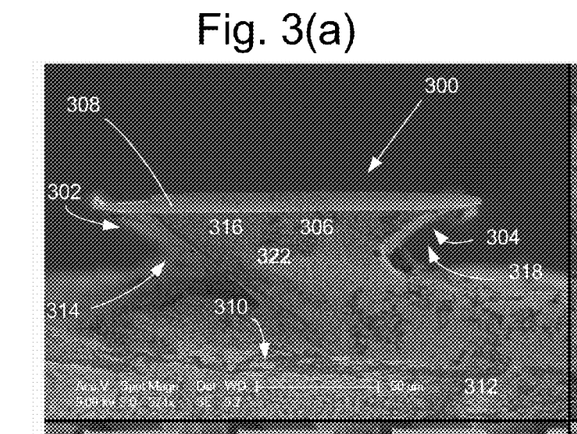
FIG. 3(a) is a higher magnification image, with a 50 µm scale, showing one device.
Figure 3B:
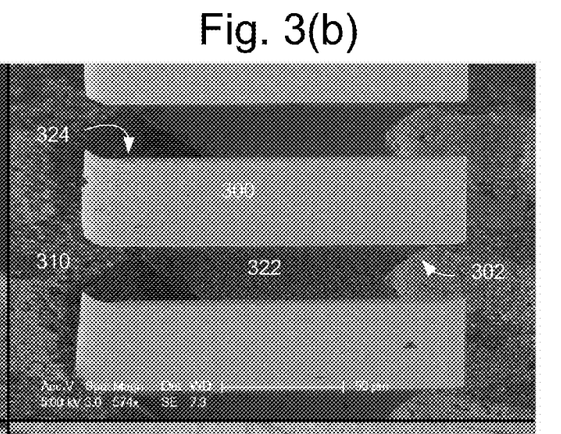
FIG. 3(b) is an image with a 50 µm scale showing 3 devices.
Figure 3C:
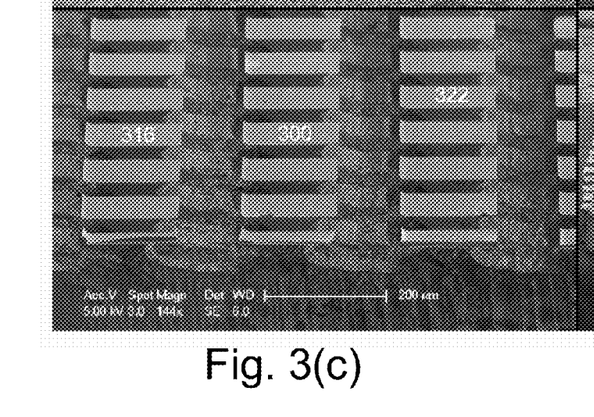
FIG. 3(c) is a lower magnification image, with a 200 µm scale showing multiple devices.
Figure 3D:
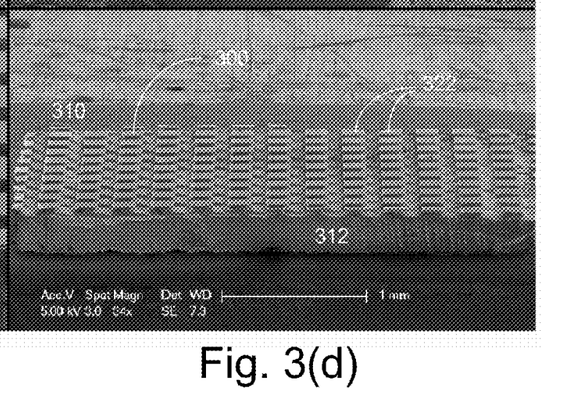
FIG. 3(d) is a yet lower magnification image with a 1 mm scale showing multiple devices.

FIG. 2 is a diagram of PEC etching with angled illumination 200 from a light source 202 onto a GaN substrate 204 having an opaque mask 206. With this technique, the material in between 208 LEDs 210 can be directly etched, and by varying the angle 212 of incident light 200, the angle 214 of the resulting sidewalls 216 can be controlled, resulting in sloped sidewalls 216 for the device 210, which will scatter guided modes out of the material 218 rather than reflecting them back. The angle 212 is varied relative to a surface 216 of the material 218, for example. The etching proceeds along the direction of the light ray 200. In FIG. 2, the angled facet 216 will be parallel to the direction of incident light 200, and this direction is chosen for optimized light extraction.

Thus, FIG. 1 and FIG. 2 illustrate an apparatus for fabricating a semiconductor device 210, comprising an electrochemical cell 102 for chemically etching a III-V semiconductor material 104, 218 during a PEC etch; a light source 100, 202 for emitting incident light 110, 200 onto the III-V semiconductor material 104, 218, and means for re-positioning the incident light 110, 200 relative to the III-V semiconductor material 104, 218 in the electrochemical cell 102, wherein the means for re-positioning varies an angle 212 of the incident light during the PEC etch to control a direction of the PEC etching and an angle 214 of resulting sidewalls 216 of the III-V semiconductor material 104, 218, thereby chip shaping a device 210 comprised of the III-V semiconductor material 104, 218 in order to extract light emitted into guided modes that would be otherwise trapped in the III-V semiconductor material 104, 218. In FIG. 2, angle 214 is equal to angle 212.

The re-positioning of the incident light 110, 200 can be achieved using any means or method known in the art, e.g., by re-positioning the light source 100, 202 (e.g., but not limited to, using a movable mount) or varying the light beam 110, 200 direction (e.g., but not limited to, using a mirror).

Experimental Results

FIGS. 3(a)-(d) are SEM images of a sample 300 PEC etched with angled illumination, resulting in sloped sidewalls 302, 304 which will scatter guided modes out of the material 306 rather than reflecting them back. Using PEC etching, this shape (comprising sidewalls 302, 304 angled with respect to a top surface 308) can be obtained by controlling the direction of incident light during etching, rather than by mechanical dicing or crystallographic wet etching of a foreign substrate. Moreover, the PEC etch may be performed to dice wafers into distinct chips. For example, PEC etching can be used for wafer dicing without any chip shaping or shaping for increased light extraction.

PEC etching of GaN is usually performed using a broadband Xe lamp as the illumination source, with KOH or $HNO_3$ as the electrolyte, as shown in FIGS. 1 and 2. The lamp intensity and etchant concentration are chosen based on the preferred etch rate and morphology.

For LED shaping, it is necessary to etch fairly rapidly to achieve deep etches, so an experimental setup by the inventors used 1000 W illumination, 1 M $HNO_3$, and a Pt etch mask which also acts as the cathode. In this case, the experimental setup used an m-plane 310 GaN substrate 312 rather than a full LED structure as a proof of concept. For this sample 300, shown in FIGS. 3(a)-(d), two etches were done, one with the sample 300 tilted so that the left side 314 of the sample 300 is closer to the lamp, resulting in a sloped sidewall 302 on the left side 314 of the mesas 316, and then another with the right side 318 higher, shaping the right side 318 of the devices 320.

For a full LED process, it would be necessary to either perform four etches so the front 322 and back 324 of the sample 300 also had angled sidewalls, or use mirrors to etch from all sides simultaneously. Alternatively, a laser could be scanned across the sample 300 at various angles, directly controlling the etch morphology without the need for an etch mask.

It would also be possible to use other electrolytes. Most acids and bases will etch GaN under these conditions, and in particular, it is well known that KOH is a good etchant for GaN. For other material systems, there is extensive literature documenting appropriate electrolytes and light sources.

Advantages and Improvements

The present invention provides a number of benefits and advantages. For example, the chip shape can be directly controlled by the profile of the incident light. Lasers can already be programmed to map out particular paths and shapes, so it would be relatively simple to apply this to etching LEDs into an arbitrary chip shape. When a relatively low concentration of electrolyte is used for PEC etching, the etch rate is directly proportional to the intensity of incident light, with extremely low dark etch rates, so this technique allows for a wide variety of chip shapes.

In another example, LEDs shaped in this way would have increased extraction efficiency. Specifically, this process will improve the performance of III-V LEDs, especially in GaN-based devices as industry continues to move towards using devices grown on GaN substrates. Moreover, this process is inexpensive and could be made rapid and automated if a laser were used as the light source.

As GaN-based LEDs are increasingly being grown homoepitaxially on GaN substrates, this technique provides further benefits, as PEC etching can be used to etch through not just the GaN template layer (usually a few microns thick), but also through the entire GaN substrate, obviating the need to for substrate dicing, thinning, or removal, and further improving light extraction by extracting modes guided in the substrate.

In addition to shaping the chip for optimal extraction, it is also possible to shape the chip to act as a lens, focus the output light, or direct it in a particular way. A few examples of possible chip shapes are shown in FIGS. 4-10.

Process Steps

Figure 4A:
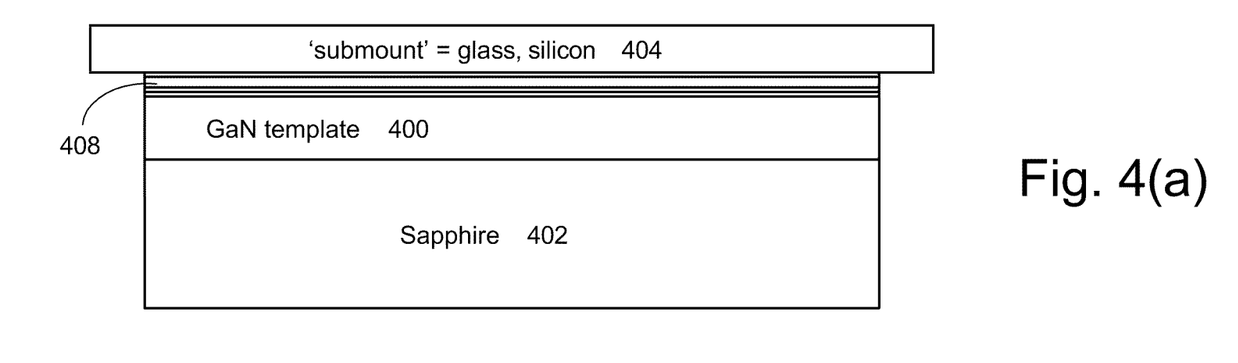
FIGS. 4(a) and 4(b) are diagrams of a first example of an LED shaping process for GaN on sapphire.
Figure 4B:
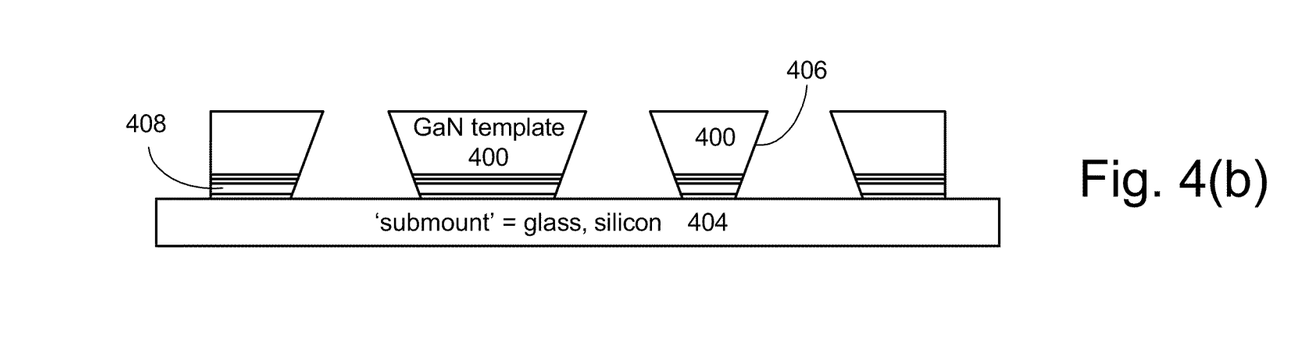

FIG. 4(a) and FIG. 4(b) are diagrams of a first example of an LED shaping process for GaN 400 on sapphire 402, which includes the steps of (1) bonding a GaN template 400 residing on a sapphire substrate 402 to a submount 404 (comprised of glass, silicon, etc.), as shown in FIG. 4(a), (2) performing a laser lift-off to remove the sapphire substrate 402 (not shown), and (3) performing a PEC etch to create sloping sidewalls 406 in the GaN template 400, as shown in FIG. 4(b). Also shown are LED device layers 408, comprising an active layer, n-type layer, and p-type layer, etc.

Figure 5A:
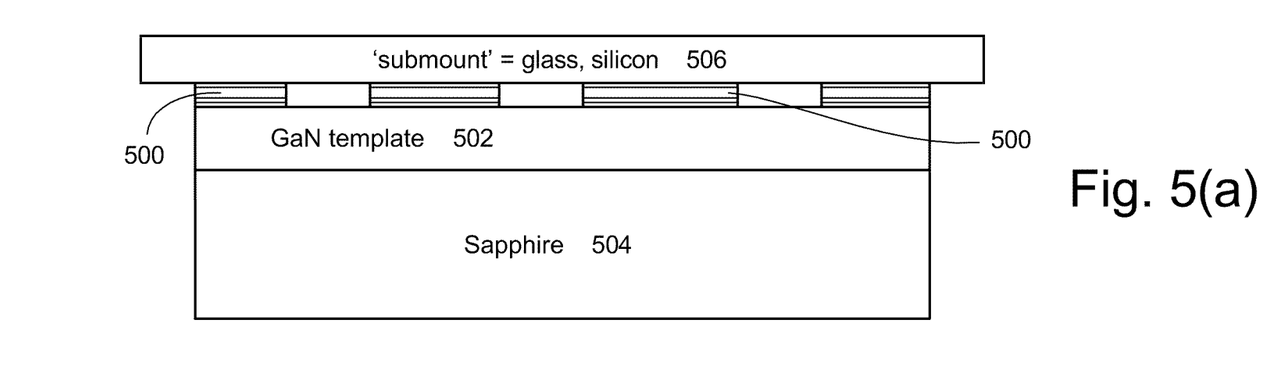
FIGS. 5(a) and 5(b) are diagrams of a second example of an LED shaping process for GaN on sapphire.
Figure 5B:
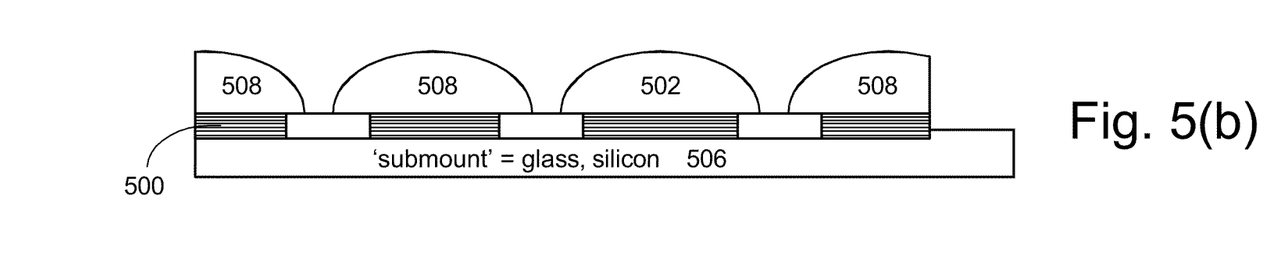

FIG. 5(a) and FIG. 5(b) are diagrams of a second example of an LED 500 shaping process for GaN 502 on sapphire 504, which includes the steps of (1) etching LEDs 500 into a GaN template 502 residing on a sapphire substrate 504, as shown in FIG. 5(a), (2) bonding the GaN template 502 to a submount 506 (comprised of glass, silicon, etc.), as shown in FIG. 5(a), (3) performing a laser lift-off to remove the sapphire substrate 504 (not shown), and (4) performing a PEC etch using lasers to create arbitrary shapes (e.g., a curved surface forming a lens 508) in the GaN template 502, as shown in FIG. 5(b).

Figure 6:
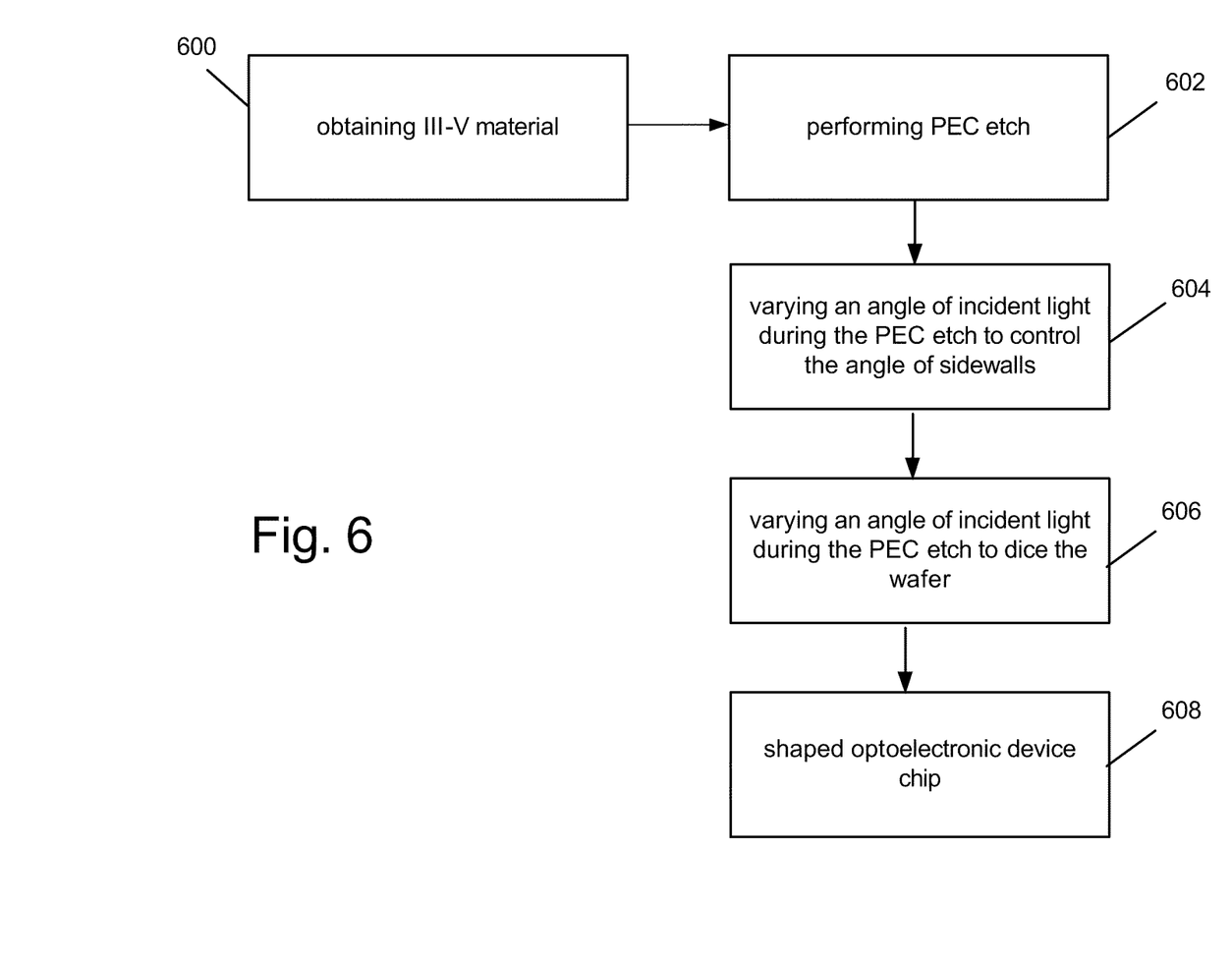
FIG. 6 is a flowchart illustrating a method of the present invention.

FIG. 6 illustrates a more general method for fabricating a semiconductor device comprising the following steps.

Block 600 represents obtaining a III-V semiconductor material comprising an n-type layer, a p-type layer, and an active region grown on a template or substrate, wherein the active region, for generating and emitting light (e.g., into the guided modes), is in between the p-type layer and the n-type layer. The III-V semiconductor material may be a III-Nitride semiconductor material, for example. The orientation (e.g., growth plane or surface) of the III-Nitride material, and a light emitting surface of the active region, may be an m-plane, a-plane, semipolar plane, or c-plane of III-Nitride, for example.

Block 602 represents performing a PEC etch for chip shaping of a device comprised of the III-V semiconductor material in order to extract light emitted into guided modes trapped in the III-V semiconductor material. If a concentration of the electrolyte is low enough, the etch rate may be proportional to the intensity of incident light.

Block 604 represents varying an angle of incident light during the PEC etch to control one or more angles of one or more resulting surface(s) (e.g., top surface or sidewalls) of the III-V semiconductor material, thereby achieving the chip shaping. For example, the angle of the incident light may be varied such that the sidewalls of the III-V semiconductor material are sloped in order to scatter the guided modes out of the III-V semiconductor material rather than reflecting the guided modes back into the III-V semiconductor material. In another example, each of the surfaces may be a sidewall at a sidewall angle such that light originating from the active region is more likely to be incident on the sidewall at an incident angle greater than the critical angle for TIR, such that the sidewall totally internally reflects more of the guided modes on a first pass towards a top surface of the device, and so that more of the totally internally reflected guided modes are incident at the top surface within the critical angle for extraction.

The angle and intensity of the incident light may be varied to control a smoothness and surface roughness of the sidewall. For example, the angle or intensity of the incident light may be varied such that the surface roughness of the sidewall is sufficiently smaller than a wavelength of light, emitted by the active region of the device into the guided modes, to prevent scattering of the guided modes' light by the surface roughness. In another example, the sidewall's surface is planar or specular for the wavelength. In this regard, the present invention is able, if desired, to fabricate the angles and the surface roughness that are not substantially determined by a crystallography of the III-V semiconductor material.

The surfaces may comprise one or more curved surfaces and the chip shaping may further comprise varying the angle and/or intensity profile of incident light to fabricate the curved surfaces with a designed curvature. The device chip may be shaped to act as a lens, to focus its output light, or to direct its output light in a particular way. For example, the angle or intensity profile of incident light may shape and position a curved surface to define a lens that focuses or directs the light emitted by the active region, wherein the lens comprises III-Nitride semiconductor material. The lens may be a layer grown and shaped on top of, beneath, or on the side of the active layer, or shaped in the substrate or template, for example. The curved surface may have any shape or curvature.

Block 606 represents performing the PEC etch to dice a wafer comprising a plurality of the devices into distinct chips. The step may comprise varying an angle of incident light during the PEC etch to dice the wafer comprising a plurality of the devices (e.g., the devices that are chip shaped for enhanced light extraction) into distinct chips. However, the PEC etching can also be used for wafer dicing without any chip shaping or shaping for increased light extraction, i.e., wafer dicing generally of any device. Thus, Block 606 represents a method for wafer dicing, comprising using or performing PEC etching to dice a wafer into distinct device chips.

Block 608 represents a shaped optoelectronic device chip obtained using the method of the present invention, such as a light emitting device (LED, or laser diode), for example. The device may be a distinct chip diced from a wafer by the PEC etching.

Steps may be added or omitted as desired.

Device Embodiments

FIGS. 7-10 are examples of chip geometries that could be achieved using PEC etching according to the present invention, where the examples are based on U.S. Pat. Nos. 7,268,371 [2] and 7,279,345 [7], which are incorporated by reference herein. FIG. 7, FIG. 8, FIG. 9, and FIG. 10 from the present invention are similar to FIG. 2, FIG. 11, FIG. 30, and FIG. 33 from U.S. Pat. No. 7,268,371 [2], respectively, but the shapes are made using a different process (the method of the present invention) and the layers from different materials (the present invention's example uses III-Nitride materials) and therefore comprise a different structure.

Figure 7:
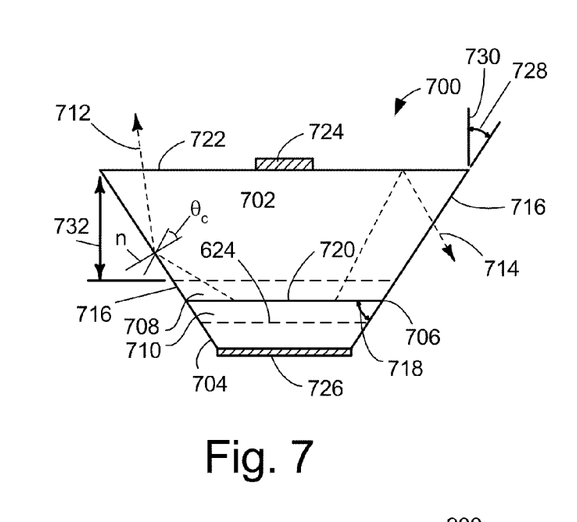
FIG. 7 is a cross-sectional schematic of a chip having a trapezoidal cross-section and based on FIG. 2 of U.S. Pat. No. 7,268,371.

Specifically, FIG. 7 illustrates an embodiment of an optoelectronic device chip (a semiconductor LED chip 700), comprising III-Nitride semiconductor material comprising a top GaN window layer 702, a bottom GaN window layer 704, a p-n junction region between the top layer 702 and bottom layer 704, wherein the p-n junction region comprises an InGaN active region 706 between a p-type GaN layer 708 and a n-type GaN layer 710, and the active region 706 is for generating and emitting light 712, 714; one or etched surfaces (sidewalls 716) of the III-Nitride material that have a surface smoothness; and an inclination of the sidewalls 716 at one or more sloped or oblique angles 718 relative to a light emitting surface 720 of the active region 706, wherein the inclination and surface smoothness enhance extraction of the light emitted into guided modes 712, 714 that would otherwise be trapped in the III-Nitride semiconductor material.

In FIG. 7 of the present invention, the top window layer 702 and bottom window layer 704 comprise doped III-Nitride material. The top window layer 702 may be a substrate or template upon which the remaining layers 706, 708, 710, and 704 are epitaxially grown. Alternatively, the bottom window layer 704 may be a substrate or template upon which the remaining layers 706, 708, 710, and 702 are epitaxially grown. Layers 706, 708, 710, 702, and 704 may be made from any III-Nitride materials (or III-V materials) conventionally used to grow III-Nitride (or III-V) LEDs. The top surface 722 of the III-Nitride nitride material, and the light emitting surface 720 may be, but are not limited to, a non-polar m-plane or a-plane of III-Nitride, for example.

Also shown in FIG. 7 are top and bottom electrical ohmic contacts 724, 726 on top layer 702 and bottom layer 704, respectively, for injecting holes and electrons, respectively, into the p-n junction region. The recombination of the electrons and holes in the active region 706 generates the light 712, 714 emitted from the active region 706 ([2] at col. 7, lines 22-25).

The sidewalls 716 of the top window 702 are oriented at an angle (or angles) 728 relative to the vertical direction 730 such that the area extent of the top surface 722 is greater than the area of the active region's 706 surfaces 720 ([2] at col. 7, lines 43-46). Thus, the orientation of the sidewalls 716 may increase the light extracting surface area of the LED 700. The relative increase in surface area of the interface (sidewalls 716 and top surface 722) between the semiconductor and exterior medium (into which light 712, 714 is extracted), relative to the surface area of the top contact 724 or of the surface 720 area of the active region 706, also reduces the probability of a photon being absorbed at those regions ([2] at col. 7, lines 59-62).

The sidewall's 716 orientation also causes (1) light 712 which strikes the sidewalls 716 to be TIR into an escape cone at the top surface 722 of the device 700, as shown by ray 712 in FIG. 7, and (2) much of the light which is TIR at the top surface 722 to be redirected into an escape cone at the sidewalls 716, as shown by ray 714 (side light may account for 40% or more of the total externally emitted light), thereby resulting in an increase in first-pass light 712, 714 extraction ([2] at col. 7, lines 51-58).

The angle 728 may be constant as a function of device height (as shown in FIG. 7), or may vary continuously according to device height to result in either partially or wholly concave or convex sidewall 716 shapes ([2] at col. 7, lines 48-51).

The critical angle $\theta_c$ for TIR may be measured with respect to the surface normal n (wherein n is perpendicular to the surface at which light is incident). Light rays 712 incident at an interface 716 at an angle larger than $\theta_c$ with respect to n are TIR and incident at surface 722 at an angle smaller than $\theta_c$ and extracted. For a III-Nitride semiconductor material with a refractive index n=2.3, and an external medium of refractive index $n_{ext}$, $\theta_c$=arc sin ($n_{ext}$/n). When air ($n_{ext}$=1) is the external medium, $\theta_c$~26°. Thus, the angles 718, 728 may be such that light 712 is more likely to be incident on the sidewall 716 at an incident angle greater than the critical angle for TIR, so that the surface 716 totally internally reflects more of the guided modes 712 on a first pass towards a top surface 722 of the device 700, and so that more of the totally internally reflected guided modes 712 are incident at the top surface 722 within the critical angle for light extraction.

The angles 728, 718 selected will depend on the application and desired output properties. The device 700 can perform the TIR towards the top surface 722 with more efficiency depending on the material and geometry used. The present invention may achieve geometry and/or angles (e.g., 718, 728) as described in reference [8], entitled "Truncated-inverted-pyramid light emitting diode geometry optimisation using ray tracing technique," by Shmatov et. al., IEEE proc. Optoelectron. Vol. 150, No. 3, June 2003, which is incorporated by reference herein.

However, the present invention is able to achieve any angle 718, 728 and is not limited to particular angles. Practical limitations may, if desired, influence the choice of the angles 718, 728 (specifically, area-yield considerations) ([2] at col. 7, lines 64-67). More information can be found in U.S. Pat. No. 7,268,371, which is incorporated by reference herein [2].

FIG. 7 illustrates an example wherein the sidewalls 716 define an LED chip 700 having at least a two sided truncated pyramid shape (however, multiple sided pyramids, such as four or six sided pyramids, are also possible) with angles 718 at the base. However, the present invention can achieve any arbitrary shape desired.

Figure 8:
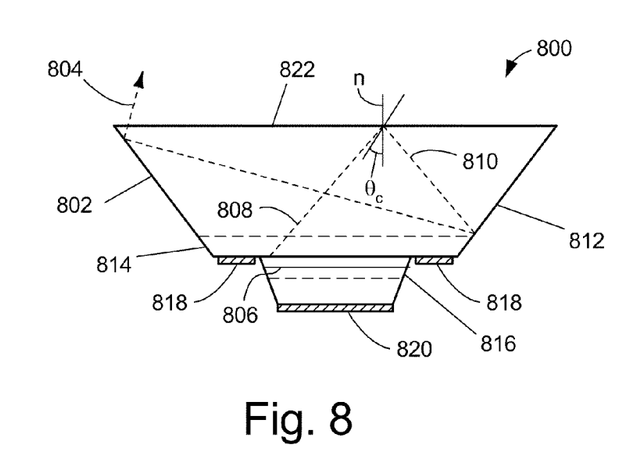
FIG. 8 is a cross-sectional schematic of a chip geometry based on FIG. 11 of U.S. Pat. No. 7,268,371.

For example, FIG. 8 depicts another embodiment of an LED 800, wherein an inclination of the LED's 800 sidewalls 802 enhances extraction of the light 804 emitted by the active region 806 into guided modes 808, 810 trapped in the III-Nitride semiconductor material 812. Also shown is the III-Nitride n-type layer 814, III-Nitride p-type layer 816, and both ohmic contacts 818 and 820 (to the n-type layer 814 and p-type layer 816, respectively) made to the bottom surface of the LED 800. The III-Nitride transparent top window layer 822 is undoped or unintentionally doped.

Figure 9:
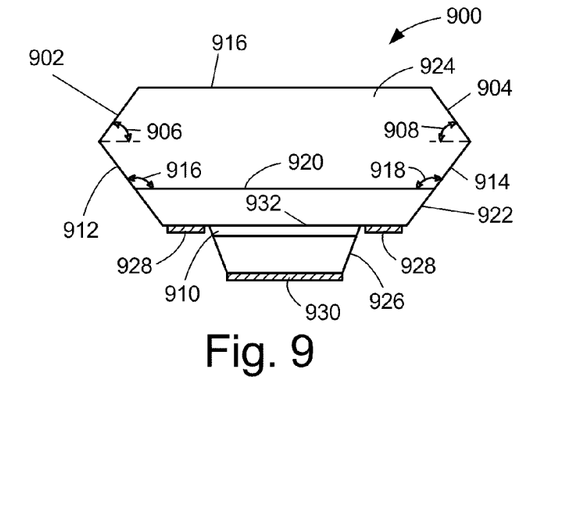
FIG. 9 is a cross-sectional schematic of a chip geometry based on FIG. 30 of U.S. Pat. No. 7,268,371.

FIG. 9 illustrates another embodiment of an LED chip 900, wherein the etched surfaces or sidewalls 902, 904 of the III-Nitride semiconductor material are sloped (e.g., at angles 906, 908 such that light originating from the active region 910 is more likely to be incident at sidewalls 902, 904 at an angle smaller than $\theta_c$ in order to scatter the guided modes out of the III-Nitride semiconductor material, rather than reflecting the guided modes back into the III-Nitride semiconductor material. The inclination of the LED's 900 sidewalls 912, 914 (e.g. at sloping angles 916, 918 so that light originating from the active region 910 is more likely to be incident at sidewalls 912, 914 at an angle greater than $\theta_c$ thereby causing TIR of the light originating from the active region 910 towards the top surfaces, e.g., 916) also enhances extraction of the light emitted by the active region 916 into guided modes trapped in the III-Nitride semiconductor material, because light is more likely to be incident at the top surface 916 at an angle smaller than $\theta_c$. The angles 906, 908, 916, 918 are shown with respect to a plane parallel to interface 920 between the n-type layer 922 and the top window layer 924. The III-Nitride material comprises the n-type layer 922, a p-type layer 926, the light emitting active layer 910, and the top window layer 924. The top window layer 924 may be a GaN substrate upon which layers 922, 926 and 910 are epitaxially grown. Ohmic contacts 928 and 930 are made to the n-type layer 922 and p-type layer 924. The positions of the p-type layer 926 and n-type layer 922 may be reversed. Also shown in a top surface 932 of the active region 910; the angles 906, 908, 916, and 918 are also with respect to this surface 932.

Other shapes, including, but not limited to, cones, are also possible.

Figure 10:
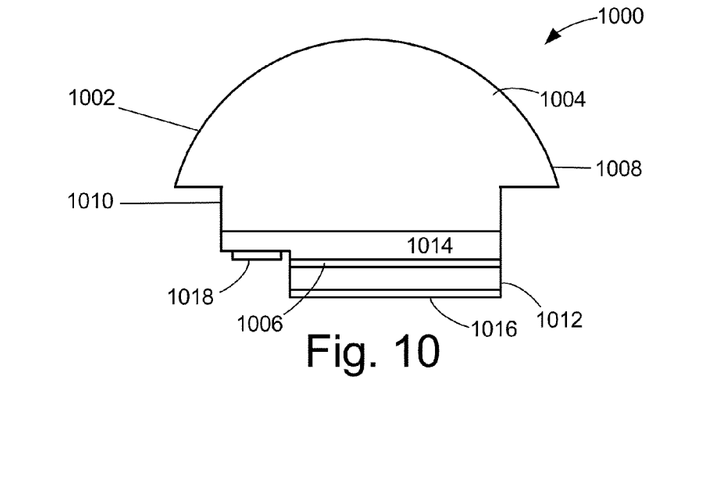
FIG. 10 is a cross-sectional schematic of a chip geometry having curved surfaces and based on FIG. 33 of U.S. Pat. No. 7,268,371.

FIG. 10 illustrates yet another embodiment of an optoelectronic device chip 1000 having a chip shape, wherein the one or more etched surfaces of the III-Nitride material of the LED 1000 comprise one or more etched curved surfaces 1002. Specifically, the one or more curved surfaces 1002 are shaped and positioned to define a lens 1004 that focuses or directs the light emitted by the III-Nitride active region 1006. The lens 1004 comprises III-Nitride semiconductor material 1008 and is a layer 1010 grown and shaped on top of the active layer 1006. The III-Nitride semiconductor material 1008 may be the template or substrate upon which the III-Nitride active region 1006, III-Nitride p-type layer 1012, and III-Nitride n-type layer 1014 are epitaxially grown and in which the lens 1004 is shaped. Also shown are ohmic contacts 1016 and 1018 to the p-type layer 1012 and n-type layer 1014 respectively.

In the above embodiments, the angles (e.g, 718, 728, 906, 908, 916, 918) and/or surface smoothness of the sidewalls (e.g., 716, 802, 902, 904, 912, 914, 1002) may, if desired, be selected independent of (i.e., not substantially determined by) a crystallography (crystallographic nature, or crystal plane orientation) of the III-V semiconductor material. Moreover, since the optoelectronic device chip shaping comprises varying an angle of incident light during the PEC etch to control an angle 718, 728, 906, 908, 916, 918 and/or surface roughness of resulting sidewalls 716, 802, 902, 904, 912, 914, 1002 of the III-V semiconductor material, the active region, p-type layer, n-type layer and surface roughness or smoothness are not degraded or determined by ion damage, sawing, sandblasting or crystallographic etching.

The method of the present invention enables formation of sidewalls 716 or curved surfaces of a device with any desired profile, e.g., smooth, rough, or patterned. For example, the surface roughness of the sidewalls 716, 1002 may be sufficiently smaller than a wavelength of the light emitted by the active region 706, 1006, such that the light is not scattered by the surface roughness and the sidewall is specular, mirror-like, or reflective for the light's wavelength. While the sidewall roughness was not measured (and in some cases, e.g., some inclined surfaces, it was not possible to measure the sidewall roughness using atomic force microscopy (AFM)), it is estimated that the present invention may vary the sidewall roughness from a root mean square (RMS) of a few nanometers (nm) to hundreds of nm depending on etch conditions. However, any arbitrary roughness or pattern on the sidewalls or surfaces is obtainable.

Thus, the present invention is able to fabricate sidewalls and other surfaces (e.g., of III-V materials such as III-Nitride) that are smoother, more specular, and more reflective, and at different angles than (as well as angles similar to) those described in references [1-6]. The present invention's fabrication, which is cheaper and simpler than other methods, may fabricate a surface smoothness and angle of the sidewalls such that anywhere from 10% to greater than a factor of two light extraction enhancement is achieved (see references), as compared to an unshaped device. Thus, the present invention may fabricate devices with higher extraction efficiency and output power than the devices described in references [1-6]. The present invention is able to fabricate devices emitting at a wide range of wavelengths, from ultraviolet to red wavelengths (e.g. 400 nm to 700 nm), for example.

Moreover, the present invention may fabricate the sidewall angles (e.g., 718, 728, 906, 908, 916, 918) with improved accuracy. The accuracy will depend on how well the optics can be controlled. For example, the present invention may fabricate the sidewall angles (e.g., 718, 728, 906, 908, 916, 918) very exactly, to better than one degree.

The inverted pyramid shape can be fabricated by other (more difficult or expensive) methods, but arbitrary shapes such as lenses have not been demonstrated.

REFERENCES

The following references are incorporated by reference herein:

[1] "High-power truncated-inverted-pyramid .Al$_x$Ga1$_{2x}$.0.5In0.5P/GaP light-emitting diodes exhibiting >50% external quantum efficiency," by Krames et. al., Applied Physics Letters 75, No. 16, 2365 (1999). This publication describes the use of a mechanical saw with AlGaInP to form truncated inverted pyramids, with an enhancement of 1.4× compared to an unshaped LED.

[2] "Light Extraction From a Semiconductor Light Emitting Device By Chip Shaping," by Krames et. al., U.S. Pat. No. 7,268,371, issued Sep. 11, 2007. This patent describes chip shaping for GaP LEDs and does mention using PEC etching. The only mention of GaN is as a possible transparent submount.

[3] "High brightness GaN-based flip-chip light-emitting diodes by adopting geometric sapphire shaping structure," by Lee et. al., Semicond. Sci. Tech. 23, 025015 (2008). This publication describes a method to crystallographically wet etch sapphire. The etch is fairly shallow, and since the substrate is so thick, it is a small perturbation to the chip shape compared to the results in [1]. The publication states that a 55% enhancement in light extraction efficiency was observed.

[4] "Enhanced output of flip-chip light-emitting diodes with a sidewall reflector," by Zhu et. al., Solid State Electron. 51, 674 (2007). This publication describes the fabrication of etched mesas using resist reflow and dry etching to erode material and obtain an angled etch, wherein the sides are coated with an $SiO_2$/Ag reflector. The publication describes a fairly shallow etch and an enhancement of only 11%.

[5] "Hexagonal pyramid shaped light-emitting diodes based on ZnO and GaN direct wafer bonding," by Murai et. al., Applied Physics Letters 89, 171116 (2006). This publication describes the use of ZnO by UCSB, the assignee of the present invention. Specifically, the publication describes a wafer bonded ZnO to p-GaN as a transparent p-contact and performing a crystallographic wet etch to obtain a pyramidal structure with the sapphire substrate still attached. The publication describes an enhancement of 2.2× as compared to a standard LED which has a thin Ni/Au transparent p-contact.

[6] "Light-Output Enhancement in a Nitride-Based Light-Emitting Diode With 22° Undercut Sidewalls," by Kao et. al., IEEE Photon. Tech. Lett. 17, 19-21 (2005). This publication describes GaN dry etched LEDs. The publication describes the use of a zero-bias dry etch to obtain facets inclined at 22° and an etch to a depth of 2.5 μm around the LEDs. The publication states that light extraction is enhanced by 1.7×.

[7] "Method of forming light emitting devices with improved light extraction efficiency," by Camras et. al., U.S. Pat. No. 7,279,345, issued Oct. 9, 2007.

[8] Truncated-inverted-pyramid light emitting diode geometry optimisation using ray tracing technique," by Shmatov et. al., IEEE proc.—Optoelectron. Vol. 150, No. 3, June 2003.

[9] Co-pending and commonly-assigned U.S. Utility Application Serial No. 12/464,723, filed on May 12, 2009, by Adele Tamboli, Evelyn L. Hu, Matthew C. Schmidt, Shuji Nakamura, and Steven P. DenBaars, entitled "Photoelectrochemical Etching of P-type Semiconductor Heterostructures," which application claims the benefit under 35 U.S.C Section 119(e) of U.S. Provisional Application Ser. No. 61/052,421, filed May 12, 2008, by Adele Tamboli, Evelyn L. Hu, Mathew C. Schmidt, Shuji Nakamura, and Steven P. DenBaars, entitled "Photoelectrochemical Etching of P-type Semiconductor Heterostructures,". This patent application describes PEC etching of p-type semiconductors by UCSB, the assignee of the present invention.

Note that references [3]-[6] above concern GaN-based LEDs. Only references [4] and [6] concern the etching of GaN, and they are limited, because the guided modes in the sapphire substrate are not extracted.

CONCLUSION

This concludes the description of the preferred embodiment of the present invention. The following describes some alternative embodiments for accomplishing the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a semiconductor device, comprising:
    performing an etch for chip shaping of a device comprised of a III-V semiconductor material, in order to extract light emitted into guided modes trapped in the III-V semiconductor material, wherein the chip shaping comprises varying an angle of incident light during the etch to control one or more angles of one or more resulting surfaces of the III-V semiconductor material.

2. The method of claim 1, wherein each of the surfaces is a sidewall at the angles such that the sidewall totally internally reflects more of the guided modes on a first pass towards a top surface of the device, wherein more of the totally internally reflected guided modes are incident at the top surface within the critical angle for extraction.

3. The method of claim 2, wherein each of the surfaces is a sidewall and the chip shaping further comprises varying the angle and intensity, or the angle or the intensity of the incident light to control a smoothness and surface roughness of the sidewall.

4. The method of claim 3, wherein the surface roughness of the sidewall is sufficiently smaller than a wavelength of the light emitted into the guided modes to prevent scattering of the guided modes' light by the surface roughness, so that the sidewall's surface is specular for the wavelength.

5. The method of claim 3, wherein the angles and the surface roughness are not substantially determined by a crystallography of the III-V semiconductor material.

6. The method of claim 1, wherein the surfaces are sidewalls and the angles of the sidewalls are such that the sidewalls of the III-V semiconductor material are sloped in order to scatter the guided modes out of the III-V semiconductor material rather than reflecting the guided modes back into the III-V semiconductor material.

7. The method of claim 1, wherein the surfaces comprise one or more curved surfaces and the chip shaping further comprises varying the angle or intensity profile, or the angle and the intensity profile, of the incident light to fabricate the curved surfaces.

8. The method of claim 1, further comprising:
    obtaining the III-V semiconductor material comprising an n-type layer, a p-type layer, and an active region grown on a Gallium Nitride template or substrate, wherein the active region, for generating and emitting the light into the guided modes, is in between the p-type layer and the n-type layer and the III-V semiconductor material is a III-Nitride semiconductor material; and
    performing the etch step to form the at least one resulting surface of the III-Nitride semiconductor material.

9. The method of claim 8, wherein the angle of the incident light shapes and positions the curved surface to define a lens that focuses or directs the light emitted by the active region, and the lens comprises III-Nitride semiconductor material.

10. The method of claim 9, wherein the lens is a layer grown and shaped on top of the active layer, or shaped in the substrate or template.

11. The method of claim 8, wherein the device is the m-plane or the a-plane device.

12. The method of claim 1, wherein the device is shaped to direct its output light in a particular way.

13. The method of claim 1, wherein the etch is performed to dice a wafer comprising a plurality of the devices into distinct chips.

14. The method of claim 1, wherein the etch is a photoelectrochemical (PEC) etch.

15. The method of claim 1, wherein the etch is a wet etch.

16. An apparatus for fabricating a semiconductor device, comprising:

an electrochemical cell for chemically etching a semiconductor device chip, comprising III-V semiconductor material, during a photoelectrochemical (PEC) etch;

a light source for emitting incident light onto the III-V semiconductor material; and means for re-positioning the incident light relative to the III-V semiconductor material in the electrochemical cell, wherein the means for re-positioning varies an angle of the incident light during the PEC etch to control an angle of resulting sidewalls of the semiconductor device chip, thereby chip shaping the device comprised of the III-V semiconductor material in order to extract light emitted into guided modes trapped in the III-V semiconductor material.

17. The apparatus of claim 16, further comprising means for varying an intensity of the incident light, wherein one or more of the means for varying the intensity and the means for re-positioning shape the chip to act as a lens, to focus its output light, or to direct its output light in a particular way.

18. The apparatus of claim 16, wherein the means for re-positioning dices wafers into distinct chips.

* * * * *